United States Patent
Dmitriev-Zdorov

(10) Patent No.: US 9,435,840 B2
(45) Date of Patent: Sep. 6, 2016

(54) DETERMINING WORST-CASE BIT PATTERNS BASED UPON DATA-DEPENDENT JITTER

(71) Applicant: Mentor Graphics Corporation, Wilsonville, OR (US)

(72) Inventor: Vladimir Dmitriev-Zdorov, Longmont, CO (US)

(73) Assignee: Mentor Graphics Corporation, Wilsonville, OR (US)

( * ) Notice: Subject to any disclaimer, the term of this patent is extended or adjusted under 35 U.S.C. 154(b) by 181 days.

(21) Appl. No.: 14/149,806

(22) Filed: Jan. 7, 2014

(65) Prior Publication Data

US 2014/0195866 A1    Jul. 10, 2014

Related U.S. Application Data

(60) Provisional application No. 61/749,901, filed on Jan. 7, 2013.

(51) Int. Cl.

| | |
|---|---|
| *G06F 11/07* | (2006.01) |
| *G01R 31/00* | (2006.01) |
| *H04L 1/00* | (2006.01) |
| *G06F 11/36* | (2006.01) |
| *G01R 31/317* | (2006.01) |

(52) U.S. Cl.
CPC ........... *G01R 31/00* (2013.01); *G01R 31/3171* (2013.01); *H04L 1/00* (2013.01); *G01R 31/31709* (2013.01)

(58) Field of Classification Search
CPC .............. G01R 31/00; G01R 31/3171; G01R 31/31709; H04L 1/00
See application file for complete search history.

(56) References Cited

U.S. PATENT DOCUMENTS

| | | | |
|---|---|---|---|
| 2004/0268190 A1* | 12/2004 | Kossel ...................... | H04L 1/20 714/704 |
| 2005/0111536 A1* | 5/2005 | Cranford, Jr. .......... | H04B 3/462 375/226 |
| 2006/0047450 A1* | 3/2006 | Tabatabaei ....... | G01R 31/31709 702/69 |
| 2007/0002964 A1* | 1/2007 | Xu .......................... | H04L 43/50 375/271 |
| 2008/0141090 A1* | 6/2008 | Pane ................ | G01R 31/31709 714/740 |
| 2010/0329403 A1* | 12/2010 | Beukema ........... | H03K 5/15013 375/356 |

* cited by examiner

*Primary Examiner* — Guerrier Merant
*Assistant Examiner* — Dipakkumar Gandhi
(74) *Attorney, Agent, or Firm* — Mentor Graphics Corporation

(57) ABSTRACT

The patent application discloses mechanisms that, for a given channel step or edge response, bit interval, and data dependent jitter table can directly determine the minimal eye or bit error rate opening by building a worst case pattern considering the effect of data dependent jitter. These mechanisms can be based on building an indexed table of jitter samples, preparing a structure in the form of connected elements corresponding to the jitter samples, and then applying dynamic programming to determine paths through the connected elements.

15 Claims, 4 Drawing Sheets

DETERMINING WORST-CASE BIT PATTERNS BASED UPON DATA-DEPENDENT JITTER

RELATED APPLICATIONS

This application is a non-provisional of and claims priority under 35 U.S.C. §119 to U.S. Provisional Patent Application No. 61/749,901, filed Jan. 7, 2013, entitled "Finding the Bit Pattern Minimizing The Eye Opening For A Linear Channel In the Presence Of Data-Dependent Jitter," and naming Vladimir Dmitriev-Zdorov, which application is incorporated entirely herein by reference.

FIELD OF THE INVENTION

The present invention is directed the determination worst-case bit patterns for a circuit based upon data dependent jitter.

BACKGROUND OF THE INVENTION

Modern digital electronic circuits and systems transmit or convey sequences of binary values, commonly referred to as bit sequences or digital signals. These bit sequences are often conveyed as voltage waveforms, wherein the voltage amplitude for a given time period corresponds to a binary logic value at that same time period. Each time period is typically referred to as a "bit." Accordingly, a digital signal appears as a voltage waveform in the signal lines and transmission channels of electronic systems. As a digital signal is transmitted through a circuit, various effects may cause the signal to degrade, often to the point that errors occur. The quality of the digital signal after it has been transmitted through the channel is often referred as the signals integrity, or signal integrity.

Various means exist for quantifying signal integrity, such as, for example, the bit error rate. Bit error rate measures the errors within a digital signal as defined by the ratio of incorrectly received bits to the total number of bits transmitted. Signal integrity is quantified by fidelity. In general, signal fidelity measure how closely an input signal corresponds to an output signal. Fidelity may also be used in the context of the transmission channel, where the fidelity measures how closely the output of the channel matches the input to the channel. Signal integrity has become increasingly important as the physical dimensions of new devices shrink while the speed with which these new devices operate increases. As a result, virtually all modern electronic circuits are designed with signal integrity in mind.

Designers often employ techniques to assist in optimizing the signal integrity of their designs. Various techniques that simulate or predict the signal integrity of pathways used to transmit signals within a circuit are typically employed. In many cases, these techniques are used prior to the circuit ever being manufactured. By adding simulation techniques to the design phase of a devices development, signal integrity problems can often be identified before the device is ever manufactured. For example, simulation tools can assist the designer in accounting for issues that commonly cause signal degradation, such as ringing, crosstalk, noise, ground bounce, or inter-symbol interference.

Integrated circuit (IC) design and printed circuit board (PCB) design are two areas where electronic design automation tools are commonly used to analyze, correct, or prevent signal integrity problems. In particular, the pathways that transmit signals between various components on a printed circuit board or within an integrated circuit, often referred to as channels, may be analyzed for signal integrity problems. For example, the signal integrity of a channel between a driver and a buffer of a printed circuit board (PCB) layout may be analyzed. It may be advantageous for a designer to perform this analysis so that the bit error rate of the channel may be accurately predicted and then subsequent design changes may be made based in part upon this prediction with the intent of reducing the bit error rate prior to manufacturing.

One component of signal integrity is data dependent jitter (DDJ). Data-dependent jitter is a deterministic jitter, whose value at each transition depends on the current and several preceding bits of the applied bit pattern. Such jitter causes deviation of the transition times from an 'ideally clocked' transition, which is pattern-dependent. Data dependent jitter may appear at the transmit or receive end of a channel. Such jitter can driver overclocking, power/ground bounce, power to clock and power to signal coupling. Data dependent jitter affects channel performance when transmitting a digital pattern, and should be considered when finding an eye diagram describing the characteristics of a circuit or the bit error rate (BER) of a circuit. An exhaustive bit-by-bit analysis of a circuit (or circuit design) requires millions of bits, however, and thus is often impractical.

BRIEF SUMMARY OF THE INVENTION

Aspects of the invention relate to mechanisms that, for a given channel step or edge response, bit interval, and data dependent jitter table can directly determine the minimal eye or bit error rate opening by building a worst case pattern considering the effect of data dependent jitter. As will be explained in more detail below, these mechanisms are based on building an indexed table of jitter samples, preparing a structure in the form of connected elements corresponding to the jitter samples, and then applying dynamic programming to determine paths through the connected elements. The algorithm complexity of various implementations of the invention is $N*2L$, where N is the length of the synthesized pattern, and L is the number of bits affecting jitter value at transitions.

DETAILED DESCRIPTION OF THE INVENTION

Illustrative Operating Environment

Figure 1:
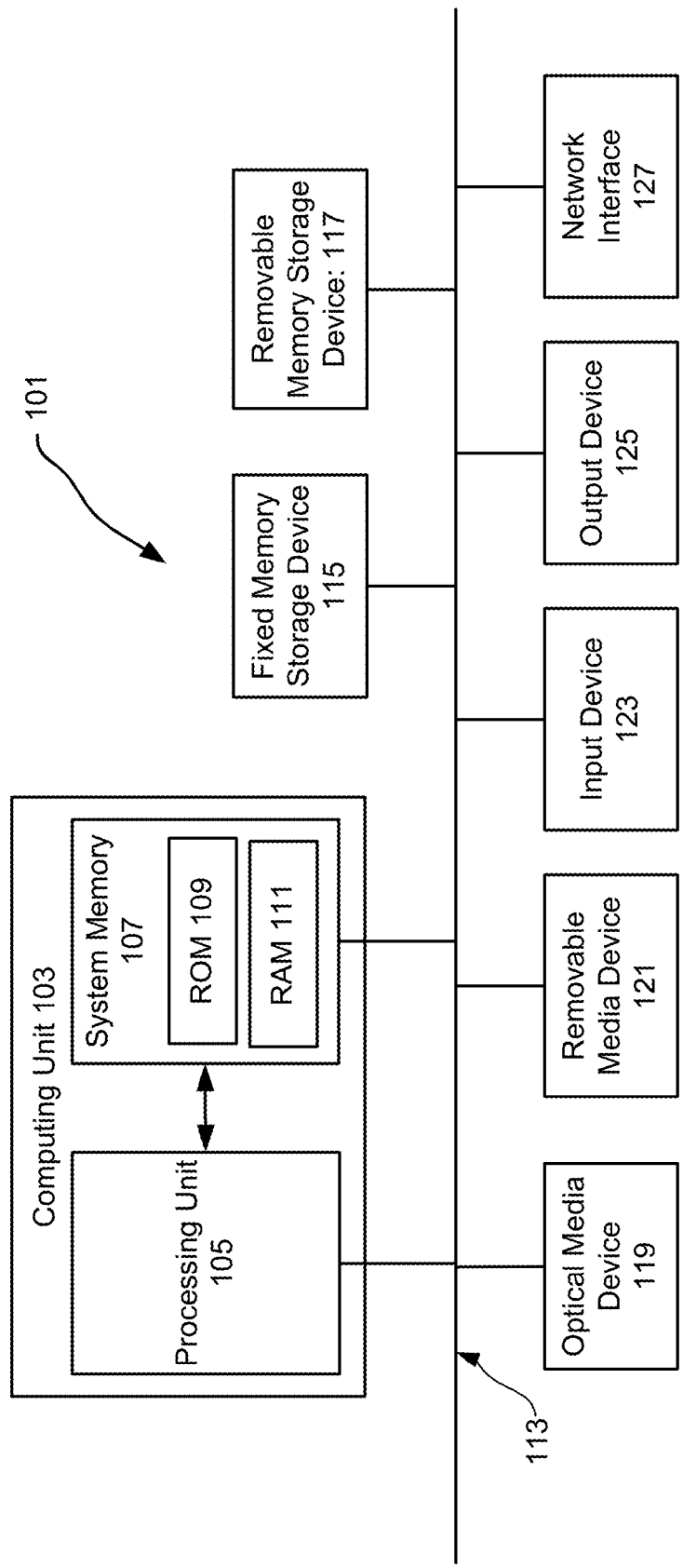
FIG. 1 illustrates a computing system suitable for use in conjunction with the present invention.

As the techniques of the present invention may be implemented using software instructions, the components and operation of a computer system on which various implementations of the invention may be employed is described. Accordingly, FIG. 1 shows an illustrative computing device 101. As seen in this figure, the computing device 101 includes a computing unit 103 having a processing unit 105 and a non-transitory system memory 107. The processing unit 105 may be any type of programmable electronic device for executing software instructions, but will conventionally be a microprocessor. The system memory 107 may include both a read-only memory device ("ROM") 109 and a random access memory device ("RAM") 111. As will be appreciated by those of ordinary skill in the art, both the ROM 109 and the RAM 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as other non-transitory memory devices, like a fixed memory storage device 115 (.e.g., for example, a magnetic disk drive) a removable memory storage device 117 (for example, a removable solid state disk drive) an optical media device 119 (for example, a digital video disk drive), or a removable media device 121 (for example, a removable floppy drive). The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus ("USB") connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol ("TCP") and the Internet protocol ("IP"). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Eye Diagrams

Figure 2A:
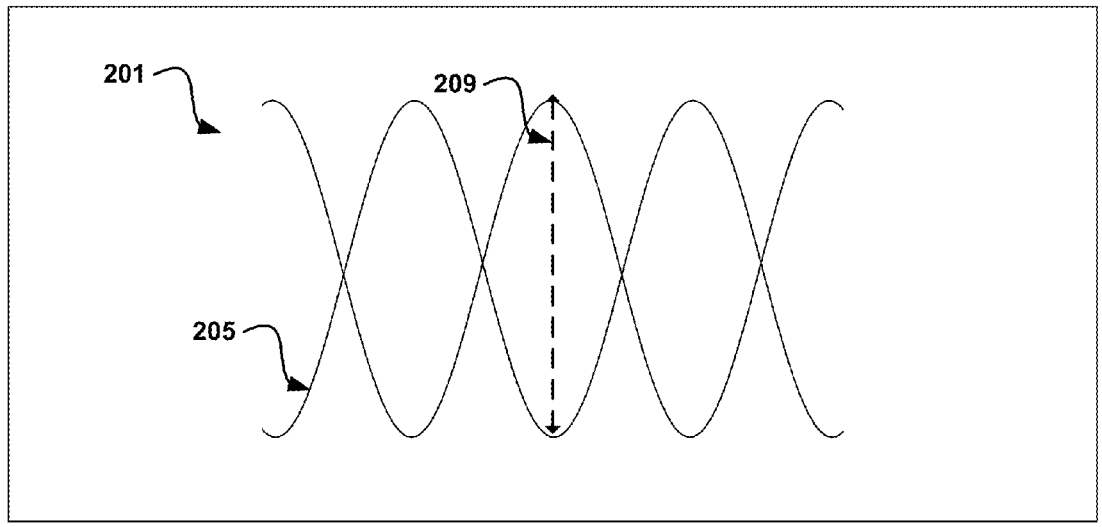
FIGS. 2A and 2B illustrate examples of "eye" diagrams showing the signal integrity of a circuit pathway.
Figure 2B:
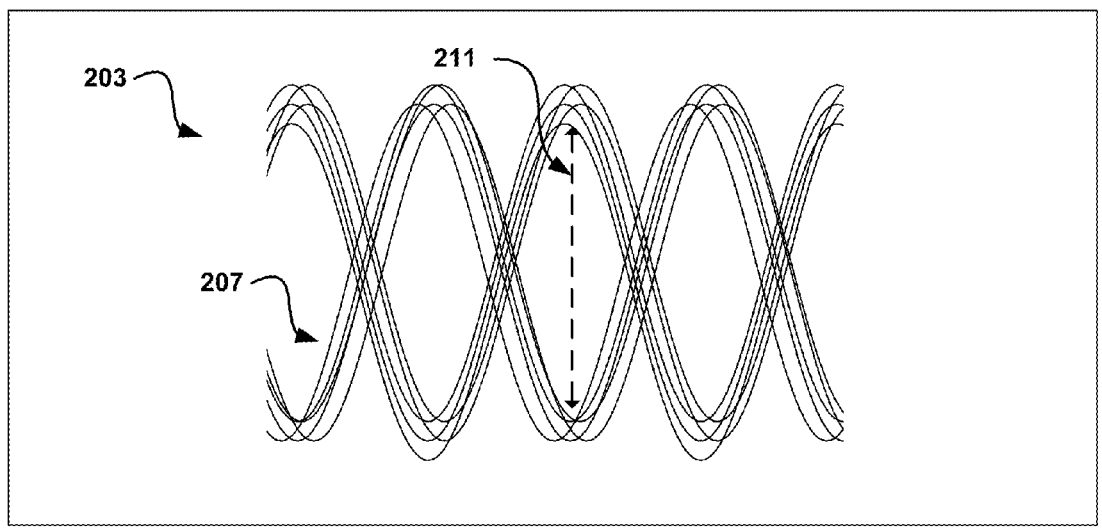

As indicated above, various implementations of the invention are applicable to determining the signal integrity of a circuit channel (either in an existing circuit or in a design for circuit). One way to quantify the signal integrity of a channel is through an "eye" diagram. An eye diagram can be created by repeatedly sampling a signal, such as, for example, by simulating the signal, and overlaying the various samples onto each other. As those of skill in the art will appreciate, the term "sampling" as used in this context, means that a waveform corresponding to a signal is captured and then subsequently partitioned. After sampling, the partitions may be overlaid onto a plot as described below. FIG. 2A illustrates an eye diagram 201, while FIG. 2B illustrates another eye diagram 203. As stated, an eye diagram is formed by repeatedly sampling a signal and then simultaneously plotting each sample. For example, FIGS. 2A and 2B show samples 205 and 207 respectively, plotted in a standard fashion with amplitude represented in the y-axis and time represented in the x-axis.

As can be seen from FIG. 2A, the samples 205 all have the same amplitude at a given time, and as such, when plotted together it appears that only a single sample 205 is plotted. Accordingly, it may be said that the eye diagram 201 is undistorted. Conversely, the samples 207 shown in FIG. 2B do not have the sample amplitude for a given time period, and, as such, when plotted together the multiple samples 207 are evident. As those of skill in the art will appreciate, the eye diagram 203 contains distortions, as evidenced by the difference between the samples 207. Eye diagrams are used by designers to depict distortions resulting from various electronic effects. For example, noise, timing issues, overshoot, and undershoot will often manifest themselves as amplitude and phase errors within an eye diagram.

Some amount of distortion is normal and accepted in electronic design. However, the amount of distortion is often checked to ensure that it falls within acceptable tolerance levels. Distortion shown in an eye diagram is often quantified by an opening in the eye diagram. FIG. 2A illustrates an opening 209 and FIG. 2B illustrates an opening 211. The amount of acceptable distortion may be quantified by an acceptable eye opening distance. Accordingly, designers will be able to determine whether the design meets acceptable signal integrity requirements based upon whether or not the eye diagram opening falls within the acceptable parameter range or not.

Data Dependent Jitter

Data-dependent jitter is a deterministic jitter, whose value at each transition depends on several preceding bits of the applied bit pattern. Such jitter causes deviation of the transition times from 'ideally clocked' transition. It may appear in a transmitter with over-clocking (where for example, Tx buffers are not fast enough for a given bit rate), or in transmitter experiencing considerable power/ground bounce caused by its own current, thus affecting its timing operation. Sometimes, it could be caused indirectly, for example by affecting the incoming clock through the power/ground network coupling. In some situations, it may be possible to measure the jitter values for a circuit directly, by applying a certain periodic input, like minimal length pseudo-random binary signals (PBRS) of a certain order. In other cases, the values of data dependent jitter can be found from a detailed Spice simulation of the transmitter circuit with a power distribution network (PDN) and its coupling to clock or signal networks.

When found, jitter values can be defined in absolute time values or fractions of a bit interval (often called a unit interval "UI"), for every possible combination of several bits. Perhaps, there are many different ways/formats of specifying such jitter, not important to the subject of this patent application. Since we need one for the purpose of further explanation, let's for convenience define DDJ by an indexed table. For example, if jitter value depends on 3 preceding bits, its value can be associated with 3+1 bit values, where the last one shows the direction of the last transition (or the lack of thereof). The pair [1001 0.04] would mean that transition from logical '0' to '1' (where '1' is the last in the group of bits) is delayed from the ideal timing by 0.04 of UI. It could be that the value is different for another combination, such as for example [01010.01]. If we operate with L bits in the group, there could be 2L different combinations of them. Typically, L is not very large: in multistage transmitter this value varies from 1-2 to 5-6. For L=4 (with 3 preceding bits) we for example may have given a table:

TABLE 1

| NN | Bit group | DDJ value (in UI) |
|---|---|---|
| 0 | 0000 | 0 |
| 1 | 0001 | 0.01 |
| 2 | 0010 | 0.01 |
| 3 | 0011 | 0 |
| 4 | 0100 | 0 |
| 5 | 0101 | 0.02 |
| 6 | 0110 | 0.01 |
| 7 | 0111 | 0 |
| 8 | 1000 | 0 |
| 9 | 1001 | 0.01 |
| 10 | 1010 | 0.02 |
| 11 | 1011 | 0 |
| 12 | 1100 | 0 |
| 13 | 1101 | 0.03 |
| 14 | 1110 | 0.02 |
| 15 | 1111 | 0 |

Figure 3:
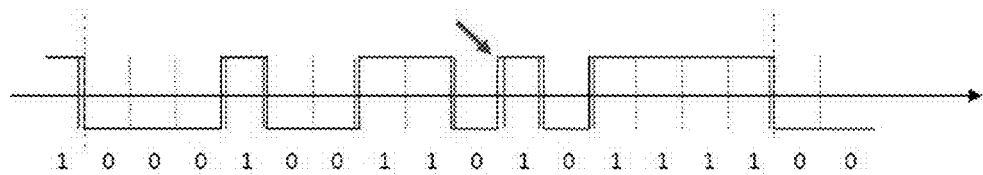
FIG. 3 illustrates an effect of data-dependent jitter on a periodic signal.

It is evident, that for any given pattern, from this table we can find the deviation from ideal switching time at any transition, by considering 3 preceding and one current bit value. FIG. 3 shows the effect of jitter specified by Table 1. An example non-jittered periodic signal is depicted in black. The period is designated by the two green marks. The jittered transitions are shown in red. The largest deviation can be observed in the middle when transitioning from '0' to '1', at the end of the group '1101', for which the table defines the value 0.03UI.

Note that jitter can always be assumed zero if the two last bits in a group are identical, since there is no transition. Thus we can reduce the table by half without losing any meaningful content. However, we won't do that here for clarity.

Minimization of an Eye Opening for a Circuit Channel

Let us have DDJ defined for a certain SERDES channel operating at a given bit rate. In addition to DDJ table, we should also have the channel's step or edge response, measured at the receiver side. This is a waveform that characterizes single switching from state '0' to '1' without the impact from other transitions. Here is the problem: find such input bit pattern of a certain length that minimizes the eye opening at the receiver.

The length of the pattern N is normally associated with the length of the edge or bit response (measured in UI) characterizing the time needed for the response to settle, and varies from tens to hundreds of bit times, N=40 . . . 200. The total number of possible bit combinations, in the length of the response is 2N that makes exhausting simulation very long and impractical. An importance of such worst case solution is evident: instead of simulating for millions of bits, it would be possible to build the eye immediately from very short pattern, or find the eye opening simultaneously with building such a pattern.

The solution is known for the case of jitter-free operation, and some other special cases, such as asymmetrical transitions (rising and falling transition responses are not identical). However, the solution for the channel with DDJ is not available. The difficulty is caused by the fact that pattern and jitter are related to each other and should be considered simultaneously.

Figure 4:
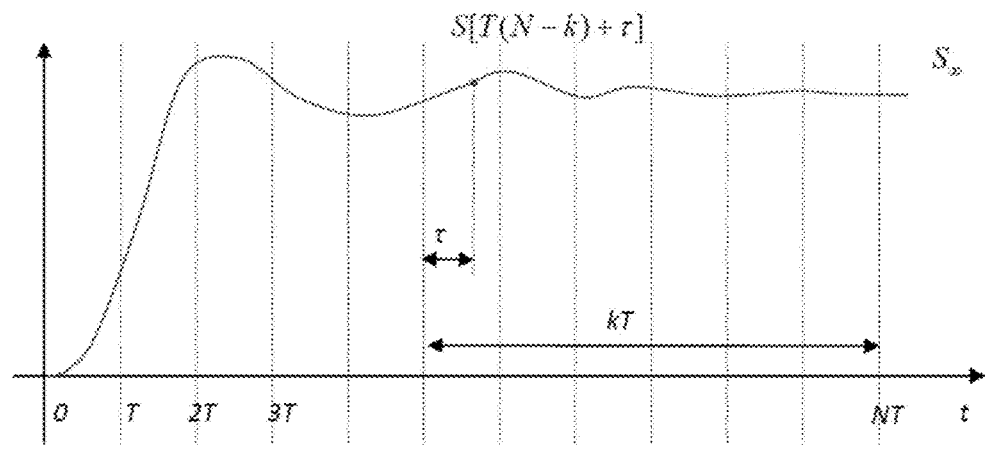
FIG. 4 illustrates an output signal of a channel expressed via its step response.

It is known that in the absence of jitter, the value of the signal at the channel's output can be expressed via its step response, and the applied pattern. We assume that the step response S(t) starts from zero and reaches the value that corresponds half the difference between the settled logical '0' and logical '1', when seen at the channel's output. Then, the transition from '0' to '1' or reverse, can be described by the doubled step response, taken with appropriate sign. The signal at the output becomes a superposition of the step response samples, as shown in FIG. 4 and described by formula (1) below:

$$Y(t) = \text{sign}(Q_0)S_\infty + \sum_{k=1}^{N} R_k S(t - kT) \quad (1)$$

Where T is a bit interval, $S_\infty$ is a settled value of S(t), $Q_k$ are coefficients representing logical levels at bit k, which could be either +1 or −1; sign ($Q_0$) defines a sign at the settled value of the step response in formula (1) which should correspond to the polarity of the bit $Q_0$ preceding the first one, thus having the index '0', and $R_k=Q_k-Q_{k-1}$ show the values of "transitions". For example if $Q_k=Q_{k-1}$ then $R_k=0$. If $Q_k$ and $Q_{k-1}$ are different, then $R_k$ is equal +2 or −2, depending on the polarity of the k−$1^{th}$ and $k^{th}$ logical states.

Typically, for a given t, it is possible to find samples of the step response and select the signs of $Q_k$ so as to minimize or maximize the output value. The problem is more complicated, however, when jitter values need to be taken into account for the variable $j_k$:

$$Y(t) = \text{sign}(Q_0)S_\infty + \sum_{k=1}^{N} R_k S(t - kT - j_k) \quad (2)$$

If we observe the output after N transmitted bits, it can be assumed that t=NT+τ, where 0<τ<T shows the position of the sample point within a unit interval. Then, formula (2) can be rewritten as:

$$Y(t) = \text{sign}(Q_0)S_\infty + \sum_{k=1}^{N} R_k S[T(N - k) + \tau - j_k] \quad (3)$$

In formulate (2) and (3), the values of $j_k$ should be determined from considering the logical values of several preceding states ($Q_{k-1}$, $Q_{k-2}$. . . ), therefore $j_k$ and $R_k$ are not independent. However, if the number of bits in the group L, as defined in the jitter table, is not large, it is possible to find jitter values for all possible combinations of preceding bits, and use them to fill a table with samples of the step response.

Assuming $S[T(N-k)+\tau-j_k]=S_{N-k}(\tau-j_w)$, where w represents the particular bit group of L bits, including the k-th bit at the end. Then, for the k-th summand, the coefficients in formula (3) can be placed into a table. For example, a case where L=3 is shown in Table 2 below:

TABLE 2

| 000 | $S_{N-k}(\tau - j_{000})$ | $R_k = 0$ |
|---|---|---|
| 001 | $S_{N-k}(\tau - j_{001})$ | $R_k = 2$ |

TABLE 2-continued

| | | |
|---|---|---|
| 010 | $S_{N-k}(\tau - j_{010})$ | $R_k = -2$ |
| 011 | $S_{N-k}(\tau - j_{011})$ | $R_k = 0$ |
| 100 | $S_{N-k}(\tau - j_{100})$ | $R_k = 0$ |
| 101 | $S_{N-k}(\tau - j_{101})$ | $R_k = 2$ |
| 110 | $S_{N-k}(\tau - j_{110})$ | $R_k = -2$ |
| 111 | $S_{N-k}(\tau - j_{111})$ | $R_k = 0$ |

By taking jitter values from Table 1 for every bit group, we can fill all the required samples of the step response, for every k=1 . . . N. In the same table, the transition values can be unambiguously associated with a selected bit group. By having the sample of the step response and the transition, the entire summand in (3) defined for every possible bit group is included in the table. Referring now to the collection of the summands for a particular bit a k-th "bit element," a bit element is represented by the content of Table 2, and may keep either samples of the step response and transitions separately, or already as the products $R_k S_{N-k}(\tau-j_w)$. Now, possible connections between different bit elements can be established, and a method of finding the optimal path in these connections employed.

Figure 5:
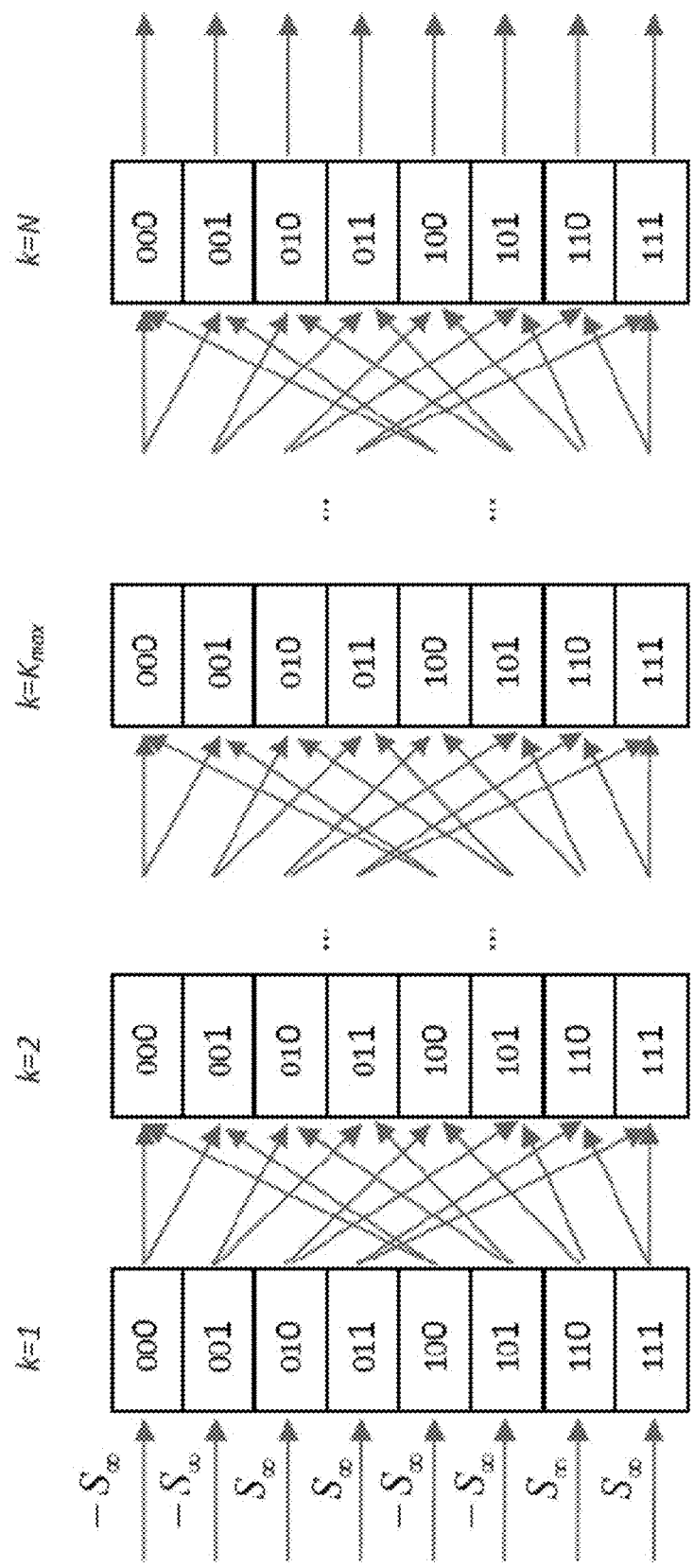
FIG. 5 illustrates a connection between different bit groups of the adjacent bit elements.

In FIG. 5, connection between different bit groups of the adjacent bit elements are shown. Within a group, the enlarged number represents the bit value selected for the current position, and the smaller-sized numbers show the preceding bits. These connections are made by considering the fact that the two last values in a k-th group become the first two values in the k+1-th group, thus making a continuous sequence. The initial values are specified on the left, at k=1. Note that their signs correspond to the last bit preceding the current in the $1^{st}$ group, which corresponds to the value $Q_0$, not included into the solution. It can be assumed that the step response coming from all earlier transitions has already settled.

The problem now is reduced to finding a path from left to right, that minimizes the sum of all summands, contained in the bit elements, when a maximally stressed eye (when receiving the bit '1') needs to be determined. Respectively, the sum if the bit being received has a state '0' needs to be maximized to make this determination. Typically, the bit to be sampled corresponds to the place where the step response has the steepest rise, or pulse response, found from the response reaches its maximum. For the response shown in FIG. 4, the peak is expected within the second bit interval, hence in our example case the one sampled is the bit element second from the right: Kmax=N−1. In all cases, Kmax can be unambiguously found from considering the step or pulse response. The bit value at k=Kmax must be fixed to the state of the expected received level, high or low. For example, if it is minimizing the received value when expecting '1' it attempted, the valid groups in Kmax-th element are only '001', '011', '101', and '111'. To exclude invalid solutions from consideration, the other groups ending on '0' could be assigned a forbiddingly large value (e.g. +1e+10) instead of their actual summand. This will automatically exclude them and the paths leading to them when finding the minimum of all summands. Likewise, if the expected value is 'low', the valid groups become those that end on '0', and the others can be excluded by assigning their summands very low value (e.g. −1e+10).

After the content in every group of every bit element is settled, the problem can be solved by dynamic programming. For example, to find the minimum (expected bit value is 'high'), the structure shown in FIG. 5 can be traversed from left to right. For every bit group in every bit element, the predecessor with the smallest sum (for k=1, the initial value shown on the left is used) is found, and the pointer to this predecessor is stored. The current sum is then computed by incrementing the sum from this predecessor by the summand stored in the bit group. After all bit groups in the element are updated, the process goes to the next bit element and repeats the previous step. After the last bit is updated, the group with the smallest sum is found. From there, the path to this group is tracked backward by using the stored pointers, and the path that leads to the smallest sum can thus be determined. By combining the bits from this path in direct order, the 'worst pattern' can be built.

For the logical '0' or 'low', the path leading to the largest sum must be found instead. The algorithm described above can be employed, remains unchanged, but the word 'smallest' should be replaced by 'largest'. The minimal or maximal sum in the last bit element is nothing but the smallest eye opening found for a given t (as defined earlier, t specifies the sampling position within bit interval, used when taking the samples of the step response in (3)). By repeating the solution for several positions, for example, $\tau$=0, 0.1 T, 0.2 T, . . . T, for positive and negative polarity, the pattern (and the eye contour) that is most constrained for a given channel response, bit interval and specified data-dependent jitter can be found.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method comprising:
   measuring data-dependent jitter capable of being introduced to a channel by a transmitter of the channel, and measuring, by a receiver of the channel, a step response associated with the channel generated in response to a bit transition by the transmitter;
   deriving, by a computing system, a sequence pattern for input into the channel based, at least in part, on the data-dependent jitter and the step response associated with the channel; and
   determining, by the computing system, a bit error rate for the channel based, at least in part, on the sequence pattern.

2. The method of claim 1, wherein deriving the sequence pattern further comprises:
   preparing a structure of connected elements;
   determining paths through the connected elements in the structure based, at least in part, on jitter samples associated with the data-dependent jitter; and
   building the sequence pattern based on the paths through the connected elements.

3. The method of claim 2, wherein deriving the sequence pattern further comprises building an indexed table of the jitter samples, wherein the structure of the connected elements is prepared based on the indexed table of the jitter samples.

4. The method of claim 1, further comprising generating, by the computing system, an eye diagram corresponding to signals capable of being transmitted over the channel in response to the sequence pattern and received at the receiver.

5. The method of claim 4, wherein the sequence pattern is a worst-case bit pattern when the eye diagram has a minimal eye opening.

6. An apparatus comprising at least one computer-readable memory device storing instructions configured to cause one or more processing devices to perform operations comprising:
identifying a measurement of data-dependent jitter capable of being introduced to a channel by a transmitter of the channel, and identifying a step response associated with the channel measured by a receiver of the channel, wherein the step response is generated in response to a bit transition by the transmitter;
deriving a sequence pattern for input into the channel based, at least in part, on the data-dependent jitter and the step response associated with the channel; and
determining a bit error rate for the channel based, at least in part, on the sequence pattern.

7. The apparatus of claim 6, wherein deriving the sequence pattern further comprises:
preparing a structure of connected elements;
determining paths through the connected elements in the structure based, at least in part, on jitter samples associated with the data-dependent jitter; and
building the sequence pattern based on the paths through the connected elements.

8. The apparatus of claim 7, wherein deriving the sequence pattern further comprises building an indexed table of the jitter samples, wherein the structure of the connected elements is prepared based on the indexed table of the jitter samples.

9. The apparatus of claim 6, wherein the instructions are configured to cause one or more processing devices to perform operations further comprising generating an eye diagram corresponding to signals capable of being transmitted over the channel in response to the sequence pattern and received at the receiver.

10. The apparatus of claim 9, wherein the sequence pattern is a worst-case bit pattern when the eye diagram has a minimal eye opening.

11. A system comprising:
a memory device configured to store machine-readable instructions; and
a computing system including one or more processing devices, in response to executing the machine-readable instructions, configured to:
identify a measurement of data-dependent jitter capable of being introduced to a channel by a transmitter of the channel;
identify a step response associated with the channel measured by a receiver of the channel, wherein the step response is generated in response to a bit transition by the transmitter;
derive a sequence pattern for input into the channel based, at least in part, on the data-dependent jitter and the step response associated with the channel; and
determine a bit error rate for the channel based, at least in part, on the sequence pattern.

12. The system of claim 11, wherein the one or more processing devices, in response to executing the machine-readable instructions, are configured to:
prepare a structure of connected elements;
determine paths through the connected elements in the structure based, at least in part, on jitter samples associated with the data-dependent jitter; and
build the sequence pattern based on the paths through the connected elements.

13. The system of claim 12, wherein the one or more processing devices, in response to executing the machine-readable instructions, are configured to build an indexed table of the jitter samples, wherein the structure of the connected elements is prepared based on the indexed table of the jitter samples.

14. The system of claim 11, wherein the one or more processing devices, in response to executing the machine-readable instructions, are configured to generate an eye diagram corresponding to signals capable of being transmitted over the channel in response to the sequence pattern and received at the receiver.

15. The system of claim 14, wherein the sequence pattern is a worst-case bit pattern when the eye diagram has a minimal eye opening.

* * * * *